United States Patent
Abouchar

(10) Patent No.: US 6,739,044 B2
(45) Date of Patent: May 25, 2004

(54) ELECTRICAL TERMINAL TINNING PROCESS

(75) Inventor: John W. Abouchar, Fullerton, CA (US)

(73) Assignee: Unit Industries, Inc., Fullerton, CA (US)

( * ) Notice: Subject to any disclaimer, the term of this patent is extended or adjusted under 35 U.S.C. 154(b) by 0 days.

(21) Appl. No.: 10/197,395

(22) Filed: Jul. 16, 2002

(65) Prior Publication Data

US 2004/0011857 A1 Jan. 22, 2004

(51) Int. Cl.[7] .............................. H05K 3/30; H01R 4/02
(52) U.S. Cl. ..................... 29/837; 439/876; 439/887; 174/262
(58) Field of Search ............................. 228/259, 33, 39, 228/180.1, 214; 29/840, 843, 837; 439/887, 888, 876; 174/251, 262

(56) References Cited

U.S. PATENT DOCUMENTS

| 3,610,811 A | * | 10/1971 | O'Keefe ..................... 174/262 |
| 3,646,572 A | * | 2/1972 | Burr ............................ 174/251 |
| 4,290,195 A | * | 9/1981 | Rippere ........................ 29/837 |
| 4,420,877 A | * | 12/1983 | McKenzie, Jr. ............... 29/739 |
| 4,422,128 A | * | 12/1983 | Zurlinden et al. .......... 361/776 |
| 5,052,954 A | * | 10/1991 | Seidler ........................ 439/876 |
| 5,152,702 A | * | 10/1992 | Pilny ........................... 439/876 |
| 5,160,579 A | * | 11/1992 | Larson ......................... 216/18 |
| 5,997,367 A | * | 12/1999 | Nowak et al. ............... 439/853 |

FOREIGN PATENT DOCUMENTS

JP 04-52258 A * 2/1992

* cited by examiner

Primary Examiner—L. Edmondson
(74) Attorney, Agent, or Firm—Knobbe, Martens, Olson & Bear LLP

(57) ABSTRACT

A method of tinning one or more electrical terminals by hot solder dipping is disclosed herein. The process generally involves placing a solder resistant material in a through hole formed in an electrical terminal, and then dipping at least a portion of the terminal into a hot solder. The solder resistant material may include, for example, a titanium or stainless steel wire, and the solder may be a tin-lead solder such as Sn63.

40 Claims, 2 Drawing Sheets

ELECTRICAL TERMINAL TINNING PROCESS

BACKGROUND

1. Field of the Invention

The invention relates in general to the field of electrical component manufacturing, and specifically to a process for tinning electrical leads.

2. Description of the Related Art

Brush blocks used in gyroscopes and synchro type electric motors can be connected electrically and mechanically by using molded-in lead wires or terminals. The terminals are frequently flat plate brass (or some other base metal), on the order of 0.015" thick and are typically plated with a material which promises better oxidation protection and thus better solderability than bare brass or BeCu. Popular plating materials include tin and silver. Unfortunately however, the tin plating eventually tends to oxidize, thus reducing the possibility of long term shelf storage. Silver also tends to develop a sulfide complex coating (e.g. such as the black tarnish seen on silver-plated dining ware), thus causing the terminals to be virtually unsolderable.

Thus, a common solution is to "tin" the terminals over the plating using a hot tin-lead solder dip, typically Sn63 (Pb37). The difference in solderability between a hot solder dipped terminal and a plated terminal is quite significant. Despite the advantages of hot solder dipping however, there remain undesirable effects. In the case of a flat plate terminal with a small diameter through hole (typically 0.040") which will later receive a wire, hot solder dipping results in partial, if not complete occlusion of the hole by solder. This solder-filled hole is typically too small to receive the wire for which the hole was intended. Of course, the additional solder could be drilled out, however this adds a costly processing step, and may potentially produce an inordinate number of rejected parts. Thus it is desirable to create a solder tinning process in which solder is prevented from occluding holes in a flat terminals during hot solder dipping.

SUMMARY

Thus, in one embodiment, a method of hot solder dipping an electrical terminal is disclosed. According to this embodiment, an electrical terminal having a through hole for receiving a wire is provided. The method further includes positioning a solder resistant material through the hole, immersing at least a portion of the terminal in hot solder, and removing the solder resistant material from the through hole.

According to another embodiment, a method of tinning an electrical terminal is disclosed. This embodiment includes providing an electrical terminal having a hole sized to receive a lead wire of a first diameter. Additionally, the method includes providing a solder resistant filament having a second diameter such that the second diameter is at least equal to the first diameter. The solder resistant filament is inserted through the hole, at least a portion of the terminal is submerged in molted solder, and the solder resistant filament is withdrawn from the hole.

In yet another embodiment, a method of tinning a plurality of electrical terminals is provided. The method includes providing a plurality of electrical terminals with through holes. The method further includes inserting a single solder resistant wire through the holes of said plurality of terminals and immersing the plurality of terminals in molten solder such that a layer of solder is deposited on the terminals. After a desired dwell time, the terminals are removed from the solder, and the wire is removed from the terminals.

For purposes of summarizing the invention and the advantages achieved over the prior art, certain objects and advantages of the invention have been described herein above. Of course, it is to be understood that not necessarily all such objects or advantages may be achieved in accordance with any particular embodiment of the invention. Thus, for example, those skilled in the art will recognize that the invention may be embodied or carried out in a manner that achieves or optimizes one advantage or group of advantages as taught herein without necessarily achieving other objects or advantages as may be taught or suggested herein.

All of these embodiments are intended to be within the scope of the present invention herein disclosed. These and other embodiments of the present invention will become readily apparent to those skilled in the art from the following detailed description of the preferred embodiments having reference to the attached figures, the invention not being limited to any particular preferred embodiment(s) disclosed.

BRIEF DESCRIPTION OF THE DRAWINGS

Having thus summarized the general nature of the invention, certain preferred embodiments and modifications thereof will become apparent to those skilled in the art from the detailed description herein having reference to the figures that follow, of which.

DETAILED DESCRIPTION

Although the following process is discussed in the context of tinning flat plate base metal terminals, those skilled in the art will recognize that some aspects of the present disclosure may be practiced individually, or in various other contexts. Those skilled in the art will also recognize that no single aspect of the present disclosure is essential to the process. The following embodiments are provided by way of example, and are not intended to limit the scope of the present invention, which is intended to extend beyond the embodiments disclosed below to include various other embodiments and obvious modifications thereof.

Figure 1:
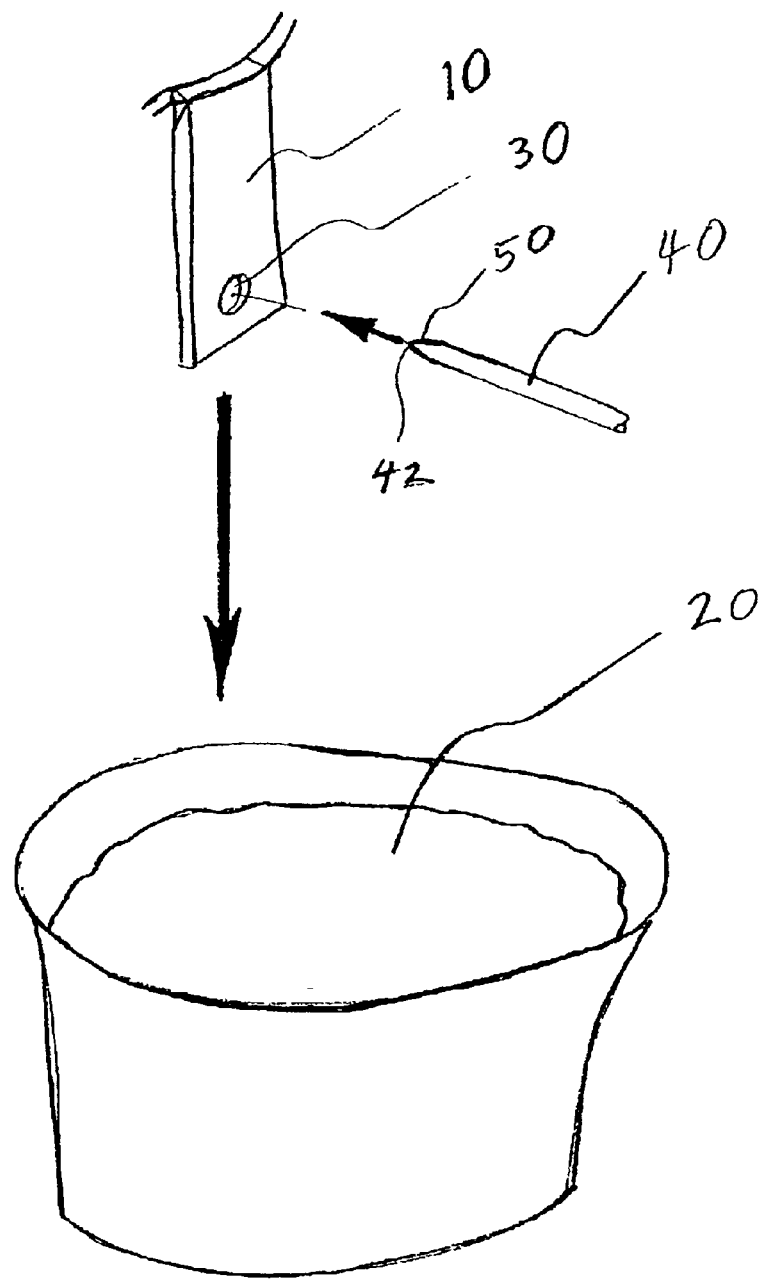
FIG. 1 is a schematic perspective view of a terminal having a hole and a solder resistant filament insertable into the hole.
Figure 2:
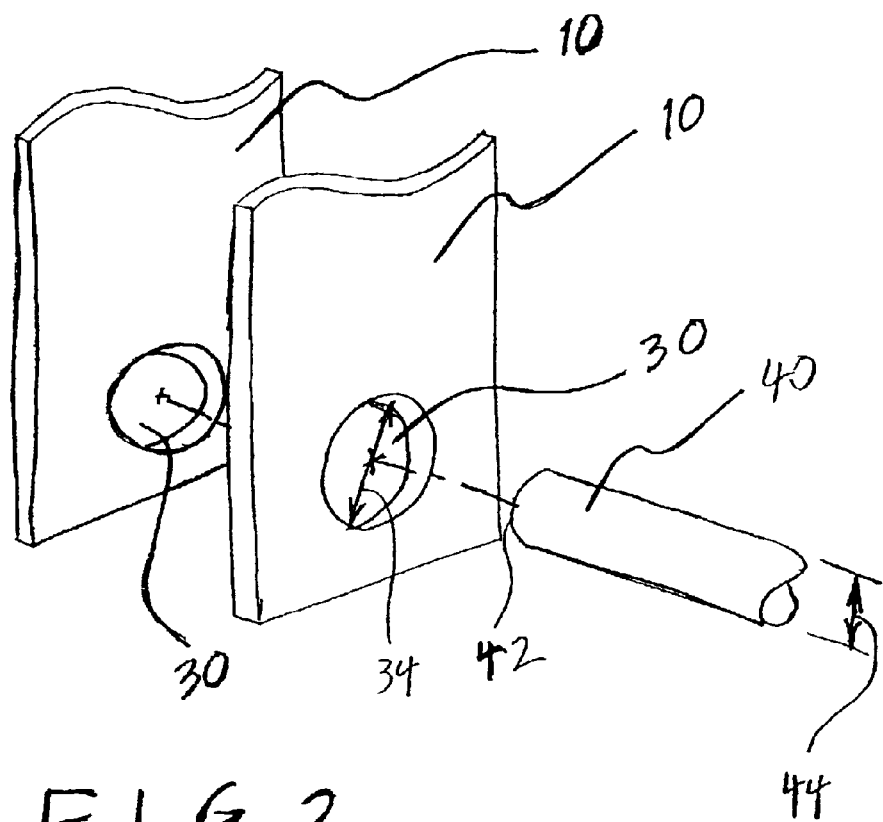
FIG. 2 is a schematic perspective view of a solder resistant filament insertable through holes of a plurality of terminals.

FIGS. 1 and 2 illustrate exemplary embodiments of a tinning process having desired features and advantages. The process generally involves one or more electrical terminals 10 to be "tinned" by dipping the terminal 10 in a hot molten coating material such as solder 20. Typically, the process will be practiced with Sn63 solder, however any of a variety of other solder alloys may also be used. The present method is particularly useful in tinning electrical terminals 10 having through holes 30 formed therein. Alternatively, the present method may be utilized to mask or contour a solder coat in any of a variety of notches, grooves or other structures other than a through hole 30. Such applications may be accomplished by wrapping a solder resistant material or otherwise maintaining the solder resistant material in proximity to the area to be masked, prior to immersion or otherwise bringing the component into contact with a molten solder bath. Such applications will become apparent to those of skill in the art in view of the disclosure herein. Through holes may be provided in a variety of diameters depending on the dimensions of the terminal, and the diameter of any lead wire to be inserted therein during later manufacturing steps. As shown in FIG. 2, the process described herein may also be employed in tinning two or more terminals 10 simultaneously.

In order to prevent the solder 20 from occluding the through holes 30 formed in the terminals, a filament 40 of a solder-resistant material may be removably inserted into the through hole(s) 30 of one or more terminals, thus preventing solder from occluding the hole(s) 30 as the terminal is dipped in hot solder. A solder resistant material is one which will resist the formation of a layer of solder thereon. Solderability and solder resistance is dependant on a variety of properties, and is thus most easily determined experimentally as will be understood by those skilled in the art. Thus, those skilled in the art will be able to select a suitable solder-resistant material through routine experimentation.

In one embodiment, the solder resistant filament 40 is a titanium wire. Alternatively, the solder resistant filament 40 may comprise a beryllium or stainless steel wire, or any alloy of titanium, beryllium, stainless steel or other metal which will resist solder adhesion. Non-metallic filaments may also be used provided that the material has a sufficiently high melting point that the filament is substantially unaffected by the molten solder 20. The particular material selected for the solder resistant filament 40 may have some effect on the solder coating surrounding the hole 30. For example, titanium wire has been found to provide a substantially undisturbed coating upon removal of the wire from the hole after hot solder dipping, while removal of a stainless steel wire may disturb the coating slightly.

A wire or filament 40 to be used in the tinning process may have a tapered or pointed tip 50 in order to facilitate insertion of the filament 40 into the hole in the terminal 10. Of course, a tapered end is not necessary for the process to be successful, however the filament 40 will preferably be substantially free from burrs or other irregularities on its leading edge 42 which would prevent the filament 40 from being easily inserted through a terminal hole 30.

The diameter 44 of a solder resistant filament 40 may be selected to fit through the terminal holes with a relatively small clearance. As such the diameter 34 of a terminal hole 30 will usually be a few thousandths of an inch larger than the diameter 44 of a filament 40. However, the relationship between the diameter of the solder resistant filament 40 and the desired post coating through hole may be varied depending upon the solder resistant nature of the material of the filament 40. For example, the use of a titanium solder resistant filament 40 has been determined to not only resist solder adhesion to the titanium, but repel solder for a small distance from the titanium. Thus, the resulting through hole may have a greater diameter than the diameter of the solder resistant filament 40. Accordingly, optimization of the diameter of the solder resistant filament 40 taking into account the desired finished through hole size and the materials involved may be accomplished through routine experimentation by those of skill in the art in view of the disclosure herein. In many embodiment, it is anticipated that the diameter of the filament 40 will be at least about 80%, and often at least about 90% or more of the desired diameter of the finished through hole, depending upon the nature of the materials involved.

In some applications, the diameter 44 of the solder resistant filament 40 may be at least as large as the diameter of a wire to be inserted through the terminal hole 30 during subsequent manufacturing. For example, a terminal with a 0.040" through hole which is expected to receive a lead wire having a diameter of 0.030" may be hot solder dipped with a titanium wire having a diameter of between 0.030" and 0.040" in order to insure that the lead wire may later be inserted through the hole and soldered to the terminal. Of course, those skilled in the art will understand how to choose an optimum a filament size for a desired terminal hole size.

Although the solder resistant filament 40 has been described above as having a diameter, suggesting a circular cross-section, the invention may be practiced using any of a variety of configurations or cross-sections for the solder resistant material. For example, in applications where the patency of a through hole is being preserved, as described above, the filament 40 may have a rectangular cross-section such as square, or other rectangular configurations such as a flat ribbon having a significantly different cross section in each of two perpendicular axes. Oval or elliptical, or even compound shapes may be utilized, depending upon the configuration of the desired foot print or through hole to be left following the application of the solder coat.

Referring to FIG. 2, the solder resistant filament 40 is illustrated as coaxially aligned with a first and a second through hole on a first and a second electrical terminal 10. A wide variety of electrical components have at least two, and often as many as ten or twenty or more coaxially aligned through holes 30, through which a single solder resistant filament 40 may be readily inserted. In addition, a plurality of discrete components (e.g., switches, sockets, subassemblies and other components which are configured for receiving electrical wires) may be held by a fixture or other alignment structures in a linear pattern such that the through holes 30 in a variety of distinct but adjacent components are coaxially aligned, enabling solder resistant filaments 40 of any of a wide variety of lengths to be axially advanced therethrough. Following the coating process, this enables a single wire 40 to be retracted from a potentially large number of coaxially aligned apertures 30. Since a single component may have a plurality of electrical contacts 10, each having one or more apertures 30, an array of components may be simultaneously dipped having two or more filaments 40 extending therethrough, such as in parallel to maintain patency of two parallel rows of apertures 30, or at angles to each other, such as perpendicular angles or otherwise, depending upon the alignment of the apertures 30. Following the tinning process, the solder resistant filaments 40 may be removed and the components released from the fixture for subsequent packaging or processing.

Although the invention has been described primarily in the context of dipping the terminal 10 in a hot molten solder bath, the present invention may additionally be utilized with other tinning techniques, such as heating solder paste, spraying, painting or the like in which a molten material is applied to an electrical terminal 10.

Depending upon the nature of the fixture, methods in accordance with the present invention may be automated. For example, in a process involving the solder tinning of a large number of identical components, components may be aligned in a fixture and the solder resistant wire 40 may be automatically distally advanced along a path which is coaxial with one or more aligned apertures 30. Following the dipping or other coating process, the filament 40 is thereafter proximally retracted from the apertures 30, thereby enabling electrical components to be removed. Axial distal advance and proximal retraction of the solder resistant filament 40 may be accomplished in an automated or semi-automated manner, depending upon the desired manufacturing technique.

Alternatively, titanium or other solder resistant wire 40 may be manually or automatically advanced through one or more coaxial apertures 30 and severed at both ends, such that the solder resistant filament fully is carried by the electrical component through the tinning process. The filament ends may be cold headed, bent, or partially wrapped around the end terminals. The solder resistant filament 40 may thereafter be removed either at the point of manufacture, or may be carried with the component to the point of installation in an electronic assembly. In this method, the solder resistant filament 40 may provide additional structural support for the electrical contacts 10, such as during shipping or other handling steps where the electrical contacts 10 may have a risk of being bent out of alignment. The solder resistant filament 40 may thereafter be removed such as by clipping and retraction at the point of installation into the finished assembly. The desirability of any of the foregoing variations will be apparent to those of skill in the art in the context of any particular component and manufacturing process.

In addition, although the present invention has been described primarily in the context of positioning the solder resistant filament 40 through the aperture 30, depending upon the dimensions of the aperture 30 and other physical considerations in the process, the solder resistant filament 40 or other structure comprising a solder resistant material may accomplish the desired function of maintaining aperture size if it is merely brought into proximity of the through hole 30 but without actually extending completely through the through hole 30. Thus, a plurality of co-planar electrical contacts 10 in which each aperture 30 resides in the same plane as, and is not coaxial with the other co-planar apertures 30, may be solder protected by applying a support structure having a plurality of solder resistant protrusions, each aligning with a unique aperture 30. The protrusions may be in the form a plurality of short wires, or other protrusion, which can be positioned adjacent the plane of the electrical connectors 10 such that each of the short wires extends into and, optionally, through the corresponding through hole 30.

Two co-planar apertures 30, residing on adjacent electrical contacts may thus be solder protected by providing a solder resistant element generally in the form of a "u" or staple. Functionally this staple comprises a first and a second solder resistant element depending from a support. The axial length of the support is sufficient to position the two legs or solder resistant elements such that they can be coaxially aligned with and inserted into the corresponding apertures. In the case of "n" co-planar apertures, the support can be provided with "n" corresponding solder resistant elements as will be apparent to those of skill in the art in view of the disclosure herein.

Although certain preferred embodiments and examples have been described herein, it will be understood by those skilled in the art that the present inventive subject matter extends beyond the specifically disclosed embodiments to other alternative embodiments and/or uses of the invention and obvious modifications and equivalents thereof. Thus, it is intended that the scope of the present inventive subject matter herein disclosed should not be limited by the particular disclosed embodiments described above, but should be determined only by a fair reading of the claims that follow.

What is claimed is:

1. A method of hot solder dipping an electrical terminal, comprising the steps of:

providing an electrical terminal having a through hole for receiving a wire;

positioning a solder resistant filament adjacent the hole;

immersing at least a portion of the terminal in hot solder; and removing the solder resistant filament after withdrawal from the hot solder.

2. The method of hot solder dipping an electrical terminal of claim 1, wherein the solder resistant filament comprises titanium.

3. The method of hot solder dipping an electrical terminal of claim 1, wherein the solder resistant filament comprises stainless steel.

4. The method of hot solder dipping an electrical terminal of claim 1, wherein the solder resistant filament is in the form of a wire.

5. The method of hot solder dipping an electrical terminal of claim 1, wherein the solder resistant filament comprises a non-metallic material.

6. The method of hot solder dipping an electrical terminal of claim 1, wherein the solder comprises an alloy containing primarily tin and/or lead.

7. The method of hot solder dipping an electrical terminal of claim 1, wherein the solder resistant filament is positioned through the hole.

8. A method of tinning an electrical terminal comprising:

providing an electrical terminal having a hole formed therein, said hole being sized to receive a lead wire having a first diameter;

providing a solder resistant filament having a second diameter, said second diameter being at least equal to said first diameter;

inserting the solder resistant filament through the hole;

submerging at least a portion of said terminal in molten solder;

withdrawing the solder-resistant filament from the hole.

9. The method of claim 8, wherein the solder resistant filament is titanium wire.

10. The method of claim 8, wherein the solder resistant filament is stainless steel wire.

11. The method of claim 8, wherein the solder resistant filament comprises a tapered tip.

12. The method of claim 8, wherein the solder comprises tin and/or lead.

13. The method of claim 8, wherein the solder resistant filament is removed after the solder on the terminals has cooled.

14. A method of tinning a plurality of electrical terminals comprising:

providing a plurality of electrical terminals, each terminal comprising a through hole;

inserting a single solder resistant wire through the plurality of holes of said plurality of terminals;

immersing said plurality of terminals and said wire in molten solder such that a layer of solder is deposited on said terminals; and removing the plurality of terminals from the solder.

15. The method of claim 14, wherein the solder resistant wire is removed after the solder on the terminals has cooled.

16. The method of claim 14, wherein the solder resistant wire comprises titanium.

17. The method of claim 14, wherein the solder resistant wire comprises stainless steel.

18. The method of claim 14, wherein the solder resistant wire comprises a tapered tip.

19. The method of claim 14, wherein the solder comprises tin and/or lead.

20. The method of claim 14, wherein the plurality of holes are coaxially aligned during at least the inserting step.

21. The method of claim 14, wherein the plurality of electrical terminals are carried by a single electrical component.

22. The method of claim 14, wherein the plurality of electrical terminals are carried by a plurality of adjacent electrical components.

23. The method of claim 14, wherein the plurality of holes through which the solder resistant wire is inserted are less than the total number of electrical terminal through-holes on an electrical component.

24. The method of claim 14, further comprising the step of removing the solder resistant wire from the plurality of holes.

25. The method of claim 8, wherein the solder resistant filament comprises a non-metal.

26. The method of claim 8, wherein said second diameter of the filament is greater than said first diameter of the wire.

27. The method of claim 1, wherein the solder resistant filament is solid.

28. The method of claim 1, wherein the solder resistant filament is a non-metal.

29. A method of hot solder dipping an electrical terminal, comprising the steps of:
   providing an electrical terminal having a through hole for receiving a wire;
   positioning a solder resistant material adjacent the hole, the solder resistant material comprising titanium;
   immersing at least a portion of the terminal in hot solder; and removing the solder resistant material after withdrawal from the hot solder.

30. The method of claim 28, wherein the solder resistant material is a solid titanium wire.

31. The method of claim 28, further comprising positioning the solder resistant material through the hole.

32. A method of hot solder dipping an electrical terminal, comprising the steps of:
   providing an electrical terminal having a through hole for receiving a wire;
   positioning a solder resistant material adjacent the hole, the solder resistant material comprising stainless steel;
   immersing at least a portion of the terminal in hot solder; and
   removing the solder resistant material after withdrawal from the hot solder.

33. The method of claim 32, wherein the wire is solid.

34. The method of claim 31, further comprising positioning the solder resistant material through the hole.

35. A method of hot solder dipping an electrical terminal, comprising the steps of:
   providing an electrical terminal having a through hole for receiving a wire;
   positioning a solder resistant wire adjacent the hole;
   immersing at least a portion of the terminal in hot solder; and
   removing the solder resistant wire slier withdrawal from the hot solder.

36. The method of claim 35, wherein the solder resistant wire comprises a tapered tip.

37. The method of claim 35, wherein the solder resistant wire comprises a non-metal.

38. The method of claim 35, wherein the solder resistant wire comprises a solid center.

39. The method of claim 35, wherein the solder resistant wire comprises a member of the group consisting of titanium, stainless steel and beryllium.

40. The method of claim 35, further comprising positioning the solder resistant wire through the hole before said immersing.

* * * * *